US010215085B2

(12) United States Patent
Yamashita et al.

(10) Patent No.: US 10,215,085 B2
(45) Date of Patent: Feb. 26, 2019

(54) TURBOCHARGER

(71) Applicant: MAHLE FILTER SYSTEMS JAPAN CORPORATION, Tokyo (JP)

(72) Inventors: Takahisa Yamashita, Tokyo (JP); Vijayakumar Sivaraman, Tokyo (JP); Haruo Iwano, Tokyo (JP)

(73) Assignee: MAHLE FILTER SYSTEMS JAPAN CORPORATION, Tokyo (JP)

( * ) Notice: Subject to any disclaimer, the term of this patent is extended or adjusted under 35 U.S.C. 154(b) by 119 days.

(21) Appl. No.: 15/492,445

(22) Filed: Apr. 20, 2017

(65) Prior Publication Data

US 2017/0328269 A1    Nov. 16, 2017

(30) Foreign Application Priority Data

May 11, 2016  (JP) .................................. 2016-095004

(51) Int. Cl.
*F02B 37/04*    (2006.01)
*F02B 37/013*   (2006.01)
(Continued)

(52) U.S. Cl.
CPC ................ *F02B 37/04* (2013.01); *F01P 3/20* (2013.01); *F01P 7/14* (2013.01); *F02B 33/34* (2013.01);
(Continued)

(58) Field of Classification Search
CPC ........ F02B 37/04; F02B 37/14; F02B 39/005; F02B 39/10; F01P 3/20; F01P 7/14;
(Continued)

(56) References Cited

U.S. PATENT DOCUMENTS 2,925,954 A * 2/1960 Spillmann ............... F04D 19/02
                                                          415/179
6,129,524 A * 10/2000 Woollenweber ........ F04D 17/12
                                                          417/366
(Continued)

FOREIGN PATENT DOCUMENTS

EP      2 229 515 B1      9/2015
GB      1510019 A  *  5/1978  ............. F04D 17/12
(Continued)

*Primary Examiner* — Thai Ba Trieu
*Assistant Examiner* — Jessica Kebea
(74) *Attorney, Agent, or Firm* — Foley & Lardner LLP

(57) ABSTRACT

In a two-stage supercharging electric-assist turbocharger, a first compressor wheel, a rotor of an electric motor, a second compressor wheel, and a turbine wheel are coaxially coupled to a same, common shaft member, in that order. A compressor housing is structured to define therein a communicating passage to accommodate the electric motor in the communicating passage. A first water jacket is formed in at least one rib integrally formed with an outer periphery of a motor housing and also serving as a radiating fin, for forced-cooling air flowing through the communicating passage. A second water jacket is formed in a motor housing for forced-cooling a stator of the electric motor. A third water jacket is formed in an intermediate housing constructing a part of the compressor housing for forced-cooling a control unit configured to control the electric motor.

7 Claims, 5 Drawing Sheets

(51) Int. Cl.

| | | |
|---|---|---|
| *F02B 37/14* | (2006.01) | |
| *F02B 39/00* | (2006.01) | |
| *F02B 39/10* | (2006.01) | |
| *F02B 33/34* | (2006.01) | |
| *F04D 17/12* | (2006.01) | |
| *F04D 25/02* | (2006.01) | |
| *F04D 25/06* | (2006.01) | |
| *F04D 27/00* | (2006.01) | |
| *F04D 29/28* | (2006.01) | |
| *F04D 29/58* | (2006.01) | |
| *F01P 3/20* | (2006.01) | |
| *F01P 7/14* | (2006.01) | |
| *H02K 5/04* | (2006.01) | |
| *H05K 5/00* | (2006.01) | |
| *H02K 11/33* | (2016.01) | |

(52) U.S. Cl.
CPC ............ *F02B 37/013* (2013.01); *F02B 37/14* (2013.01); *F02B 39/005* (2013.01); *F02B 39/10* (2013.01); *F04D 17/12* (2013.01); *F04D 25/024* (2013.01); *F04D 25/0606* (2013.01); *F04D 27/004* (2013.01); *F04D 29/284* (2013.01); *F04D 29/584* (2013.01); *F04D 29/5806* (2013.01); *H02K 5/04* (2013.01); *H02K 11/33* (2016.01); *H05K 5/00* (2013.01); *F01P 2060/12* (2013.01); *Y02T 10/144* (2013.01)

(58) Field of Classification Search
CPC .... F01P 2060/12; F04D 17/12; F04D 17/122; F04D 25/024; F04D 25/0606; F04D 29/5806; F04D 29/584; F04D 29/5853; F04D 29/5826; Y02T 10/144
See application file for complete search history.

(56) References Cited

U.S. PATENT DOCUMENTS

| | | | |
|---|---|---|---|
| 6,929,056 B2 * | 8/2005 | Meshenky | F02B 29/0462 165/125 |
| 9,709,068 B2 * | 7/2017 | Thompson | F04D 17/125 |
| 2008/0087018 A1 * | 4/2008 | Woollenweber | F01D 25/16 60/605.3 |
| 2010/0319343 A1 * | 12/2010 | Arnold | F01D 5/048 60/605.1 |
| 2012/0051952 A1 * | 3/2012 | Knoop | F04D 17/12 417/365 |
| 2015/0135707 A1 * | 5/2015 | Ono | F02B 37/10 60/605.1 |
| 2017/0335756 A1 * | 11/2017 | Donkin | F02B 37/10 |
| 2018/0038380 A1 * | 2/2018 | Morgan | F04D 29/058 |
| 2018/0231006 A1 * | 8/2018 | Sun | F04D 29/057 |

FOREIGN PATENT DOCUMENTS

| | | |
|---|---|---|
| JP | 2011-509374 A | 3/2011 |
| WO | WO 2016/098604 A1 | 6/2016 |

* cited by examiner

TURBOCHARGER

TECHNICAL FIELD

The present invention relates to a turbocharger for an internal combustion engine, and specifically to a two-stage supercharging turbocharger having an electric-assist function by means of an electric motor.

BACKGROUND ART

One such two-stage supercharging electric-assist turbocharger has been disclosed in the following Patent document 1.

In the turbocharger disclosed in the Patent document 1, a two-stage supercharging compressor section is constructed by a first compressor stage and a second compressor stage arranged adjacent to each other. An electric motor is arranged on the side of the first compressor stage, whereas an exhaust-gas turbine section is arranged on the side of the second compressor stage, in a manner so as to sandwich the first and second compressor stages between the electric motor and the turbine section. The turbine section is driven by exhaust gas energy. The first compressor wheel, the second compressor wheel, the motor rotor, and the turbine wheel are integrally coupled to a same, common shaft.

A first flow passage is provided outside of a stator (stator coils) of the motor for introducing air through the first flow passage into the suction side of the first compressor stage. Also provided is an intercooler (i.e., a heat exchanger) installed in a second flow passage, through which the pressure side of the first compressor stage and the suction side of the second compressor stage are connected to each other.

CITATION LIST

Patent Literature

Patent document 1: Japanese Unexamined Patent Application Publication No. 2011-509374, corresponding to European Patent No. EP 2 229 515 B1

SUMMARY OF THE INVENTION

However, with the configuration of the prior-art turbocharger as disclosed in the above patent document 1, the air, which is introduced into the suction side of the first compressor stage, flows through the first flow passage arranged outside of the motor stator, and thus a motor-stator cooling effect can be expected by the air flow through the first flow passage. However, more of the quantity of heat removed from the motor stator is delivered to the first compressor stage. The quantity of heat, which is delivered to the first compressor stage, is an disadvantage in rising a boost pressure at the first compressor stage and also in rising a boost pressure at the second compressor stage subsequently to the first compressor stage.

Additionally, according to the configuration of the prior-art turbocharger, prior to introducing the air from the pressure side of the first compressor stage into the second compressor stage, the air discharged from the pressure side of the first compressor stage is cooled by means of the intercooler, which is disposed in a middle of the second flow passage and arranged outside of a body including a body part of the compressor section and a body part of the turbine section. Thus, the redundant flow passage system including the second flow passage as well as the first flow passage leads to a pressure loss. Also, the air discharged from the pressure side of the first compressor stage has more of the quantity of heat removed from the motor stator, and thus a comparatively large thermal load is applied to the intercooler. Therefore, the prior-art turbocharger system requires a comparatively large capacity of intercooler. Necessarily, the entire system configuration of the turbocharger including the intercooler has to be undesirably increased in size.

It is, therefore, in view of the previously-described drawbacks of the prior art, an object of the invention to provide a turbocharger configured to improve the performance to cool air suctioned into each compressor stage of a multistage compressor section as well as air introduced into a stator of an electric motor, and consequently to further increase a boost pressure.

According to one aspect of the invention, a turbocharger comprises a turbine wheel driven by exhaust gases exhausted from an internal combustion engine, a first compressor wheel and a second compressor wheel both coaxially connected to the turbine wheel through a shaft member, a main housing that accommodates therein the first and second compressor wheels and has a communicating passage defined inside of the main housing for sending air pressurized by the first compressor wheel to the second compressor wheel, an electric motor having a cylindrical motor housing and installed in the communicating passage and structured to share the shaft member common to the first and second compressor wheels and the turbine wheel as a rotation axis, a plurality of radiating fins provided between the main housing and the motor housing inside of the main housing and configured to partition the communicating passage into a plurality of regions in a circumferential direction, a control unit configured to control the electric motor, and a cooling mechanism structured to cool potential heat-generation portions inside of and outside of the main housing.

Additionally, the cooling mechanism comprises a first cooling part placed in the radiating fins for cooling the air in the communicating passage by cooling water supplied to the first cooling part, a second cooling part placed in the motor housing for cooling a stator of the electric motor by cooling water supplied to the second cooling part, and a third cooling part having a cooling structure that cools the control unit by cooling water supplied to the third cooling part.

Preferably, the control unit is fixedly positioned on an outer periphery of the main housing or the control unit is positioned adjacent to the main housing as an external control unit separated from the main housing.

In the case that the control unit is fixedly positioned on the outer periphery of the main housing, preferably, the first cooling part is a first water jacket formed in at least one of the plurality of radiating fins, the second cooling part is a second water jacket formed in the motor housing, and the third cooling part is a third water jacket formed in a part of the main housing.

To ensure the high-efficiency cooling performance, preferably, a distribution means (a cooling-water distributor) is further provided in a cooling-water supply system of the cooling mechanism, for switching between a supply mode and a shut-off mode of cooling water supplied through the distribution means to each of the first, second, and third cooling parts, depending on an operating condition of a vehicle on which the internal combustion engine is mounted.

Alternatively, a distribution means (a cooling-water distributor), which is provided in a cooling-water supply system of the cooling mechanism, may be structured to predetermine a flow rate of cooling water to be distributed to each of the first, second, and third cooling parts, depending on a cooling load of each of the first, second, and third cooling parts.

Furthermore, to improve the cooling effect for cooling the air in the communicating passage, preferably, the radiating fins are configured to protrude radially outwards from an outer periphery of the motor housing as viewed in an axial direction of the shaft member, and continuously formed over an entire axial length of the electric motor from a first axial end of the electric motor facing the first compressor wheel to a second axial end of the electric motor facing the second compressor wheel.

In a similar manner to the above, to improve the cooling effect for cooling the electric motor, preferably, in the electric motor, the air prevailing in an inlet of the communicating passage is introduced through a first axial end of the motor housing facing the first compressor wheel into the motor housing, and the introduced air is exhausted from a second axial end of the motor housing facing the second compressor wheel into an outlet of the communicating passage.

Effects of the Invention

According to the invention, the electric motor is installed in the main housing, in which the communicating passage is defined, and arranged between the first-stage compressor wheel (the first compressor wheel) and the second-stage compressor wheel (the second compressor wheel). Additionally, the first cooling part, which has a structure that cools the air in the communicating passage, and the second cooling part, which has a structure that cools the stator of the electric motor, are provided independently of each other. Hence, there is a less tendency for the air suctioned or introduced into the second-stage compressor wheel as well as the air suctioned or introduced into the first-stage compressor wheel to be thermally affected by heat generated by the electric motor. In particular, the combined provision of the first cooling part and the second cooling part, which are appropriately placed independently of each other, are advantageous with respect to the air cooling performance of air suctioned into the second-stage compressor wheel and the motor-stator cooling performance. Therefore, it is possible to greatly improve the boost pressure.

Additionally, the third cooling part, which has a structure that cools the control unit for electric-motor control, is placed independently of the first and second cooling parts, and thus a motor-control function of the control unit can be maintained stably. Also, there is a less tendency for the air suctioned or introduced into each of the compressor wheels to be thermally affected by heat generated by the control unit.

Furthermore, in the case that the control unit is fixedly positioned on the outer periphery of the main housing, the first, second, and third cooling parts are eventually built in the main housing. Hence, an external cooler (or an external heat exchanger), separated from the main housing, is unnecessary. This is very advantageous with respect to downsizing and space-saving around the turbocharger.

The other objects and features of this invention will become understood from the following description with reference to the accompanying drawings.

DESCRIPTION OF THE PREFERRED EMBODIMENTS

Figure 1:
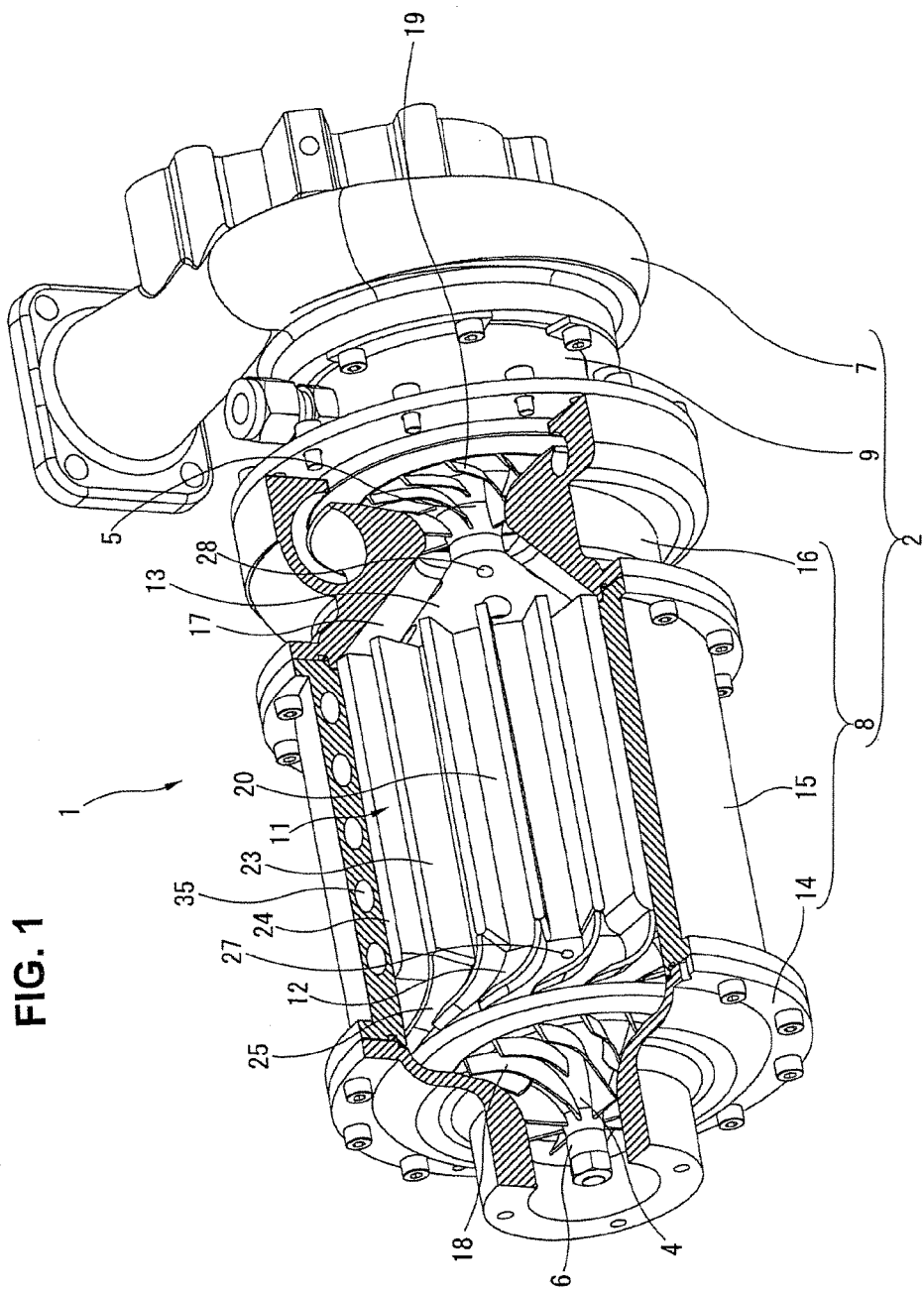
FIG. 1 is a partially cutaway view in perspective of a preferred embodiment of a turbocharger according to the invention.
Figure 2:
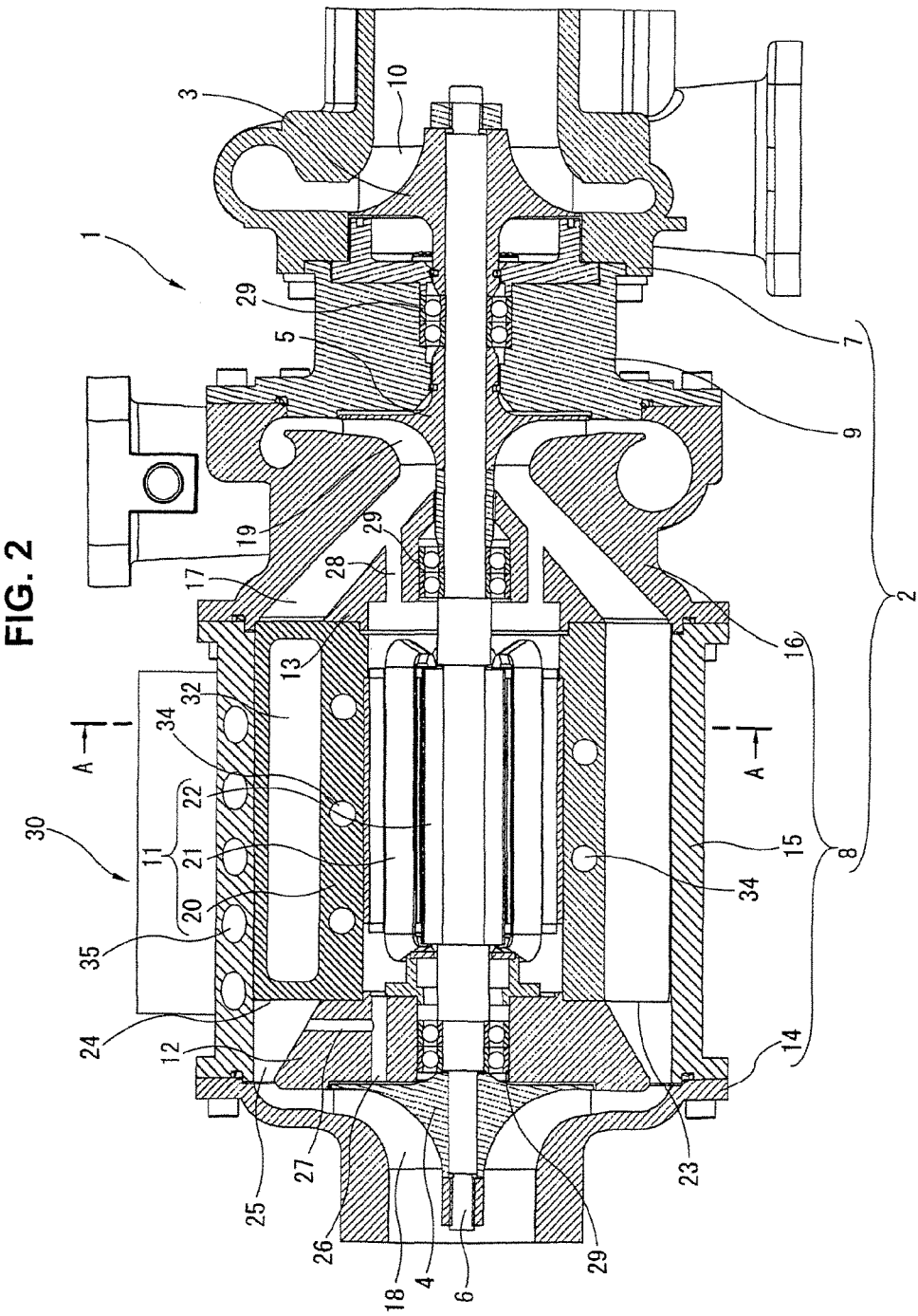
FIG. 2 is a longitudinal cross-sectional view of the turbocharger of the embodiment shown in FIG. 1.
Figure 3:
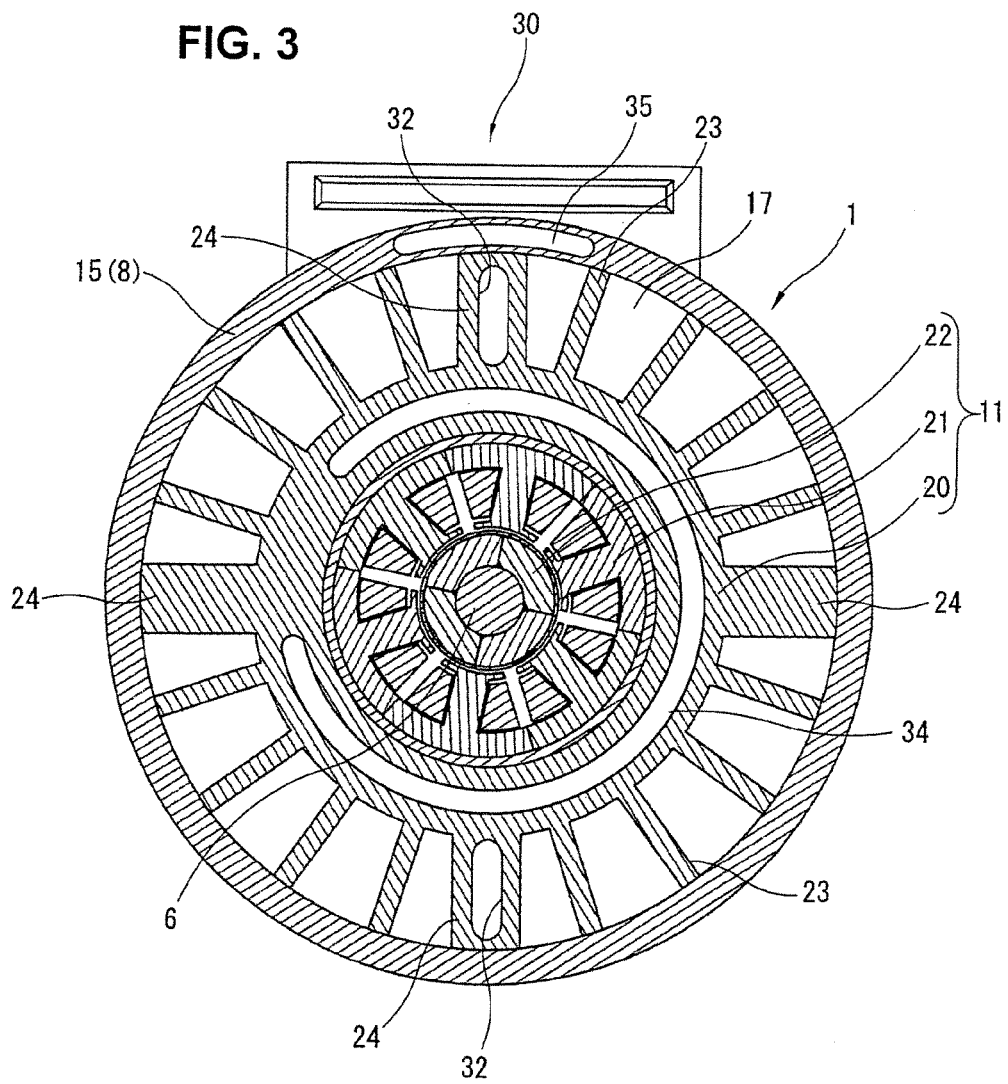
FIG. 3 is a lateral cross-sectional view taken along the line A-A of FIG. 2.
Figure 4:
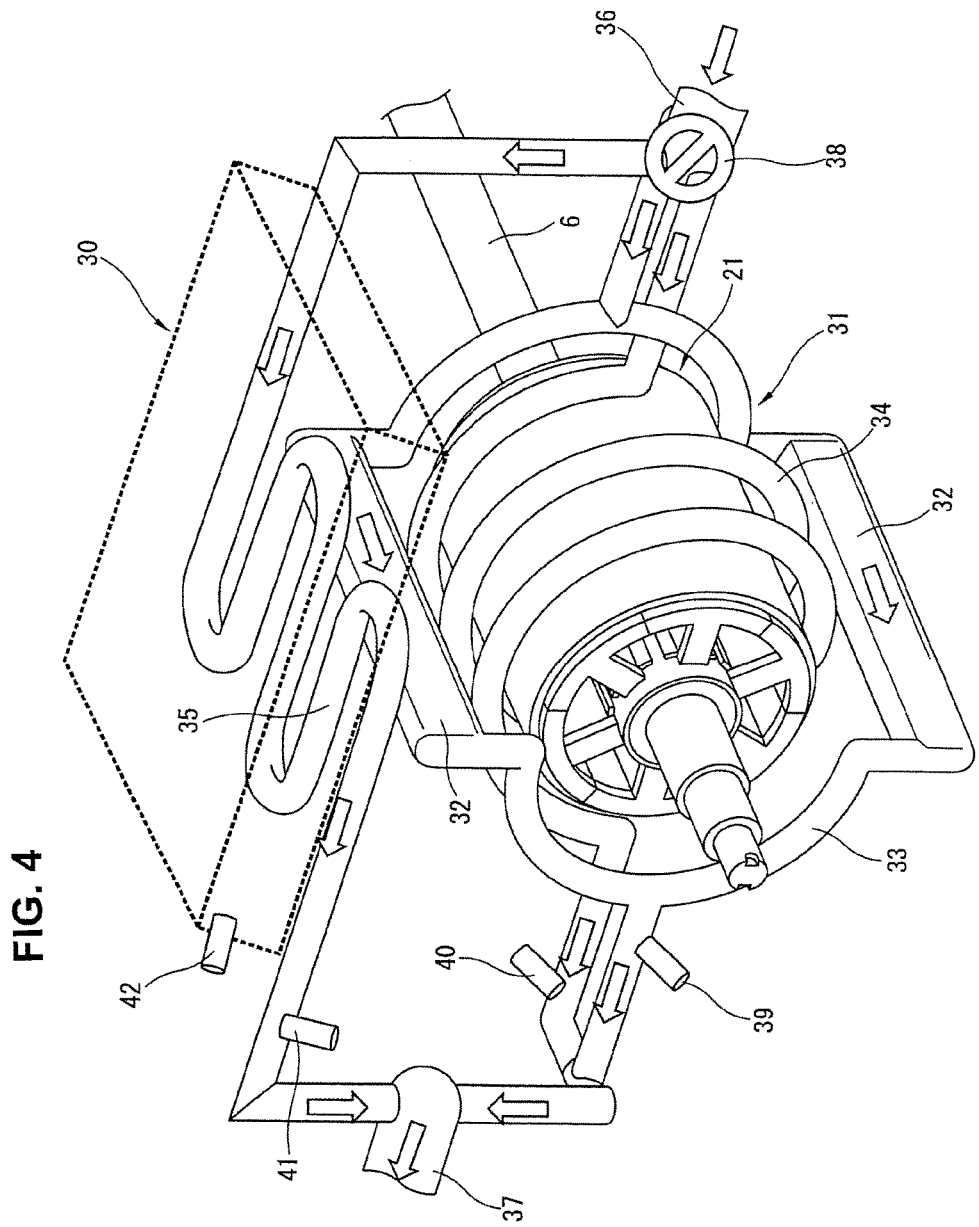
FIG. 4 is a schematic perspective view extracting only the water cooling system of the turbocharger shown in FIGS. 1-3.
Figure 5:
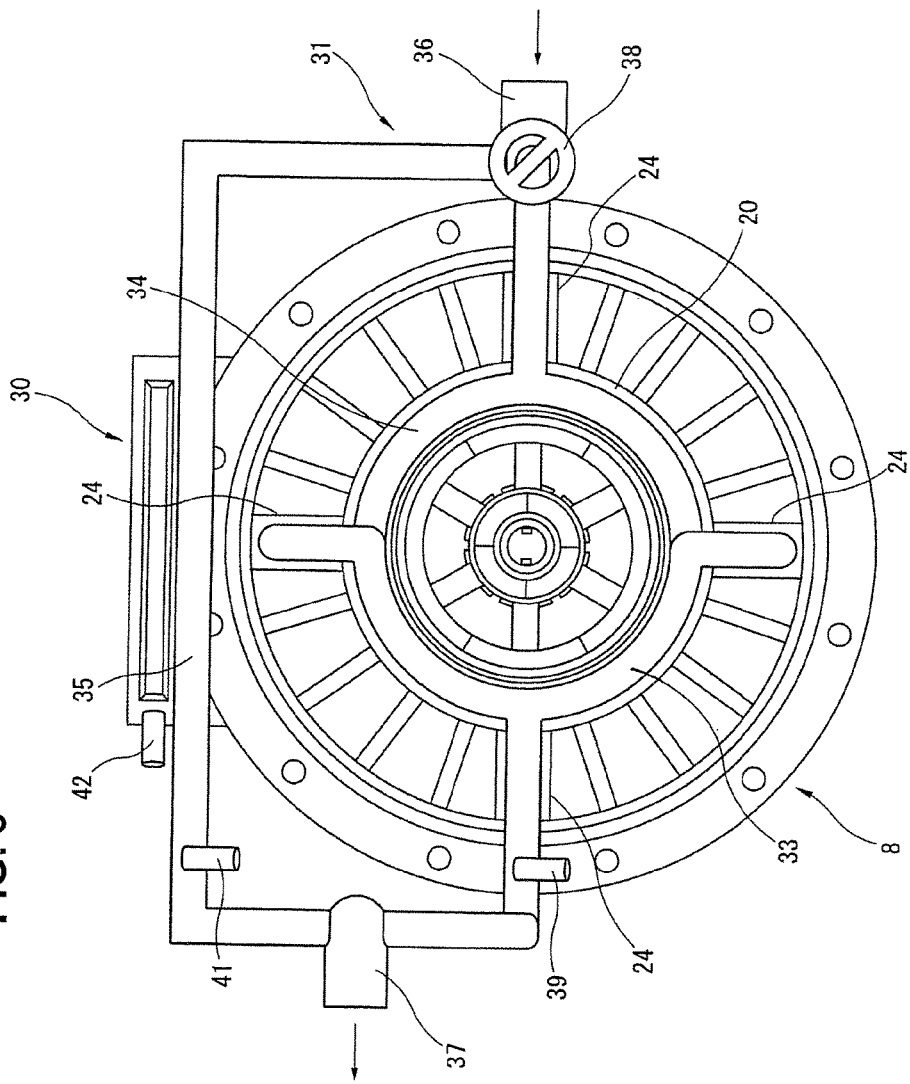
FIG. 5 is a left-hand side view of the water cooling system shown in FIG. 4, as viewed in the axial direction of a shaft member of the turbocharger.

The detailed description of embodiments of a turbocharger according to the invention will be given with reference to the accompanying drawings. FIG. 1 is a partially cutaway view in perspective of a turbocharger 1 of the embodiment. FIG. 2 is a longitudinal cross-sectional view of the turbocharger 1 of the embodiment shown in FIG. 1. FIG. 3 is a lateral cross-sectional view taken along the line A-A of FIG. 2. FIG. 4 is a schematic perspective view illustrating the water cooling system of the turbocharger 1 shown in FIGS. 1-3. FIG. 5 is a left-hand side view illustrating the water cooling system shown in FIG. 4.

Referring now to FIGS. 1-2, turbocharger 1 is a two-stage supercharging turbocharger in which air to be fed into an intake system of an internal combustion engine (not shown) mounted on a vehicle can be compressed or supercharged within a turbocharger housing 2 in two stages. That is to say, turbocharger 1 is configured such that a rightmost-end turbine wheel 3, a leftmost-end first compressor wheel (a first compressor impeller) 4, and an intermediate second compressor wheel (a second compressor impeller) 5 are coaxially installed onto an elongated cylindrical shaft member 6 common to the turbine wheel 3, the first compressor wheel 4, and the second compressor wheel 5, for supercharging air by exhaust gas energy.

Turbocharger housing 2 is formed into a substantially cylindrical shape. The substantially cylindrical turbocharger housing 2 is mainly constructed by a right-hand side turbine housing 7, a left-hand side compressor housing 8 serving as a main housing, and an intermediate housing 9 located between the turbine housing 7 and the compressor housing 8. Shaft member 6 is formed into a stepped cylindrical shape. The stepped cylindrical shaft member 6 is accommodated in the turbocharger housing 2.

Shaft member 6 is made of a metal material. Turbine wheel 3 is fixedly connected to the right-hand axial end of shaft member 6. The first compressor wheel 4 is fixedly connected to the left-hand axial end of shaft member 6. The second compressor wheel 5 is fixedly connected to the intermediate portion of shaft member 6. Shaft member 6 is rotatably supported by bearings 29 at three different axial positions of shaft member 6, adjacent to the turbine wheel 3, the first compressor wheel 4, and the second compressor wheel 5, respectively.

Three members, namely, the turbine housing 7, the compressor housing 8, and the intermediate housing 9 are formed of cast products, for example, metal cast products.

As shown in FIG. 1, turbine housing 7 is formed into a substantially volute shape. Turbine wheel 3 is accommodated in the turbine housing 7. Turbine wheel 3 is made of a metal material and formed as a metal cast product. Turbine wheel 3 has a plurality of turbine blades 10.

Intermediate housing 9 serves to mainly support the shaft member 6. Intermediate housing 9 also serves to couple the turbine housing 7 and the compressor housing 8 together in an axial direction of the shaft member 6.

The first compressor wheel 4, the second compressor wheel 5, an electric motor 11 interposed between the first compressor wheel 4 and the second compressor wheel 5, a first cylindrical member 12 interleaved between the first compressor wheel 4 and the electric motor 11, and a second cylindrical member 13 interleaved between the second compressor wheel 5 and the electric motor 11 are all accommodated in the compressor housing 8.

Hereupon, compressor housing 8 is mainly constructed by a first housing 14 that houses and covers the first compressor wheel 4, a second housing 15 (an intermediate housing) that accommodates therein the electric motor 11 and the first cylindrical member 12, and a third housing 16 that houses and covers the second cylindrical member 13 and the second compressor wheel 5. Compressor housing 8 has a communicating passage 17 defined inside of the compressor housing 8, for sending air pressurized (compressed) by the first compressor wheel 4 to the suction side of the second compressor wheel 5. Communicating passage 17 is located between the first compressor wheel 4 and the second compressor wheel 5 along a longitudinal direction of the compressor housing 8 containing both the second housing 15 and the third housing 16, and formed as a substantially cylindrical-hollow, comparatively large space defined between the outer periphery of shaft member 6 and the inner periphery of compressor housing 8.

The first housing 14 serves to mainly accommodate the first compressor wheel 4. The second housing 15 serves to mainly accommodate both the first cylindrical member 12 and the electric motor 11 in the communicating passage 17. The second housing 15 also serves to couple the first housing 14 and the third housing 16 together in the axial direction of the shaft member 6. On the other hand, the third housing 16 serves to mainly accommodate both the second compressor wheel 5 and the second cylindrical member 13. As appreciated from the partially cutaway view of FIG. 1, in a similar manner to the turbine housing 7, the third housing 16 is formed into a substantially volute shape. The third housing 16 also serves to couple the second housing 15 and the intermediate housing 9 together in in the axial direction of the shaft member 6.

The first compressor wheel 4 is made of a metal material and formed as a metal cast product. The first compressor wheel 4 has a plurality of first compressor blades 18. The second compressor wheel 5 is made of a metal material and formed as a metal cast product. The second compressor wheel 5 has a plurality of second compressor blades 19.

As shown in FIGS. 2-3, electric motor 11 is mainly constructed by a cylindrical motor housing (a motor case) 20, a stator 21 including stator coils (stator windings) fixed to the inner peripheral side of motor housing 20, and a rotor 22 fixed to the shaft member 6 and having a plurality of permanent magnets. Electric motor 11 is structured to share the shaft member 6 common to all the first compressor wheel 4, the second compressor wheel 5, and the turbine wheel 3 as a rotation axis of the motor. For instance, when sufficient supercharging action cannot be achieved owing to a shortage of rotation of turbine wheel 3, electric motor 11 comes into operation. Hence, a shortage of rotation of turbine wheel 3 can be supplemented by driving the turbine wheel 3 with the electric motor 11 in operation. Electric motor 11 also serves as a generator, for instance depending on a vehicle operating condition, thereby enabling energy regeneration. Electric motor 11 is arranged to partially occupy a specified portion of the comparatively large space that provides the communicating passage 17 defined between the shaft member 6 and the compressor housing 8, the specified portion corresponding to an annular space adjacent to the outer periphery of shaft member 6 and concentric to the axis of shaft member 6.

Motor housing 20 is made of a metal material. As shown in FIGS. 2-3, motor housing 20 has a plurality of radiating fins 23 formed integral with the outer periphery of the cylindrical motor housing 20, and a plurality of ribs 24 formed integral with the outer periphery of the cylindrical motor housing 20. Each of radiating fins 23 is formed as an axially elongated radiating fin continuously extending over the entire axial length of motor housing 20. Each of ribs 24 is formed as an axially elongated rib continuously extending over the entire axial length of motor housing 20. Each of ribs 24 also serves as a radiating fin, but formed as a comparatively thick-walled rib as compared to the thickness of each of radiating fins 23. As shown in FIG. 3, the plurality of radiating fins 23 and the plurality of ribs 24 are formed to protrude radially outwards from the outer periphery of the cylindrical motor housing 20, as viewed in the axial direction of shaft member 6. The plurality of ribs 24 and the plurality of radiating fins 23 are mixed together, such that the plurality of ribs 24 are circumferentially equidistant-spaced apart from each other and that each of the ribs 24 is interposed between two adjacent radiating fins 23, 23. Top lands (top surfaces) of the plurality of radiating fins 23 and ribs 24 are kept in abutted-engagement with the inner peripheral surface of the second housing 15. Hence, with the plurality of radiating fins 23 and ribs 24 existing on the outer periphery of motor housing 20, an outer annular space of the previously-discussed comparatively large space that provides the communicating passage 17, remaining on the outer peripheral side of the cylindrical motor housing 20, is partitioned and subdivided into a plurality of segmental spaces in the circumferential direction.

In the shown embodiment, the circumferentially equidistant-spaced four ribs 24 of motor housing 20 are fixedly connected to the second housing 15 with bolts (not shown) in the radial direction of motor housing 20. The first cylindrical member 12 is fixedly connected to a first axial end of motor housing 20, facing the first compressor wheel 4, with bolts (not shown). In a similar manner, the second cylindrical member 13 is fixedly connected to a second axial end of motor housing 20, facing the second compressor wheel 5, with bolts (not shown).

As shown in FIGS. 1-2, the first cylindrical member 12 is made of a metal material and formed as a metal cast product. The first cylindrical member 12 has a plurality of rectifying fins 25 formed on the outer periphery of the first cylindrical member 12. The plurality of rectifying fins 25 are provided to rectify the flow of pressurized air on the pressure side of the first compressor wheel 4, and introduce the rectified air into the plurality of segmental spaces of the communicating passage 17, defined between the motor housing 20 and the second housing 15. A first axial end of the first cylindrical member 12, facing the first compressor wheel 4, is slightly spaced apart from the backface of the first compressor wheel 4 with a slight clearance space. A second axial end of the first cylindrical member 12, facing apart from the first compressor wheel 4, is fixedly connected to the first axial end of motor housing 20, facing the first compressor wheel 4, with bolts (not shown).

The first cylindrical member 12 has a plurality of first air introduction holes 26 (axial through holes) formed therein. The rightmost opening end (viewing FIG. 2) of the first air introduction hole 26 opens into the inside of the inner peripheral surface of motor housing 20. The leftmost opening end (viewing FIG. 2) of the first air introduction hole 26 opens into the previously-noted slight clearance space at an axial position opposed to the backface of the first compressor wheel 4. Also, the first cylindrical member 12 has a plurality of radially-extending second air introduction holes 27 formed therein. The upper opening end (viewing FIG. 2) of the second air introduction hole 27 opens through the outer peripheral surface of the first cylindrical member 12. The lower opening end (viewing FIG. 2) of the second air introduction hole 27 is connected to an intermediate portion of the first air introduction hole 26.

The second cylindrical member 13 is made of a metal material and formed as a metal cast product. The second cylindrical member 13 has a plurality of air exhaust holes 28 (axial through holes) formed therein. The rightmost opening end (viewing FIG. 2) of the air exhaust hole 28 communicates with the communicating passage 17 within the third housing 16. The leftmost opening end (viewing FIG. 2) of the air exhaust hole 28 opens into the inside of the inner peripheral surface of motor housing 20.

As appreciated from the longitudinal cross-section of FIG. 2, with the first air introduction hole 26 and the second air introduction hole 27 formed in the first cylindrical member 12, part of air, immediately after having been pressurized and compressed, is introduced from both the side of the backface of the first compressor wheel 4 and the rectifying fins 25 through the respective through holes 26 and 27 into the motor housing 20. The air introduced into the motor housing 20 axially flows through apertures among the stator coils of stator 21 and apertures between the motor stator 21 and the motor rotor 22 toward the second compressor wheel 5. Thereafter, the air is exhausted through the plurality of air exhaust holes 28 formed in the second cylindrical member 13 into the communicating passage 17 defined in the third housing 16 constructing a part of the compressor housing 8 (i.e., the main housing).

The fundamental structure of turbocharger 1 of the embodiment is as above. The function and operation of the turbocharger 1 having the fundamental structure as discussed above are hereunder described in detail.

When turbine wheel 3 is driven by exhaust gas energy, the first compressor wheel 4 and the second compressor wheel 5, both coaxially installed onto the same shaft member 6 common to the turbine wheel 3, rotate in concert with rotary motion of the turbine wheel 3. At this time, by virtue of sucking action of the first compressor wheel 4, outside air flows into the first compressor wheel 4. Additionally, by virtue of sucking action of the second compressor wheel 5, the air introduced into the communicating passage 17 constantly flows toward the suction side of the second compressor wheel 5. Therefore, it is possible to more efficiently cool the electric motor 11 while preventing the introduced air from staying around the electric motor 11, because of electric motor 11 installed in the communicating passage 17 between the first and second compressor wheels 4 and 5. Consequently, it is possible to effectively suppress a deterioration in the driving efficiency of electric motor 11, resulting from a temperature rise of electric motor 11.

For instance, during electric-assist for a boost-pressure rise with the electric motor 11 acting on the common shaft member, a deterioration in the driving efficiency of electric motor 11, which may occur owing to a temperature rise of electric motor 11, can be suppressed, thereby avoiding a risk that a desired boost pressure cannot be ensured. Consequently it is possible to ensure a sufficient boost pressure, thereby maintaining a good vehicle driving state. Also, during electric power generation (i.e., during energy regeneration), a deterioration in the driving efficiency of electric motor 11, which may occur owing to a temperature rise of electric motor 11, can be suppressed, thereby avoiding a risk that a desired electric power generation efficiency cannot be gained. Surplus rotation of turbine wheel 3, which is driven by exhaust gas energy, can be efficiently converted or regenerated to electric energy. This contributes to the improved fuel economy of the vehicle.

Additionally, radiating fins 23 are attached onto the outer periphery of motor housing 20, and thus it is possible to efficiently transfer or radiate heat from the stator 21 fixed to the inner periphery of motor housing 20 to air flowing through the communicating passage 17. As a result, it is possible to effectively suppress a temperature rise in stator 21.

Also, part of air, immediately after having been pressurized and compressed by the first compressor wheel 4, is introduced through the first air introduction hole 26 and the second air introduction hole 27 into the electric motor 11. Hence, it is possible to directly cool (i) the stator 21 that generates heat and (ii) the rotor 22 whose temperature rises due to heat generated from the stator 21, by the air introduced into the electric motor 11. That is, it is possible to more efficiently cool from the inside and the outside of the electric motor 11.

Furthermore, air can be pressurized and compressed in two stages by means of the first compressor wheel 4 and the second compressor wheel 5. Therefore, it is possible to ensure a desired boost pressure, even under a comparatively low rotational speed of the shaft member 6, thereby suppressing heat generated from the electric motor 11. Additionally, the electric motor 11 can be downsized. Moreover, it is possible to ensure a desired boost pressure without so much increasing a supercharging ratio attained by the first-stage compressor wheel (i.e., the first compressor wheel 4). Hence, a temperature rise in air compressed by the first compressor wheel 4 can be reduced, thus enabling the electric motor 11 to be efficiently cooled.

Furthermore, the two-stage supercharging turbocharger 1 is configured such that air is pressurized and compressed in two stages and that a shortage of rotation of turbine wheel 3 can be supplemented by electrically assisting the turbine wheel rotation through the use of the electric motor 11. Hence, it is possible to realize or build a compact turbocharger system that enables a good supercharging efficiency from a low speed range, even through the use of the comparatively downsized electric motor 11. Additionally, by working or operating the two-stage supercharging turbocharger 1 at comparatively low speeds, it is possible to suppress or reduce a centrifugal force as well as a torque. Thus, the mechanical strengths of bearings 29 that rotatably support the common shaft member 6 and the mechanical strength of electric motor 11 can be properly reduced. In other words, the overall size of the electric-assist system itself including at least the electric motor 11 and the bearings 29 can be appropriately reduced. This contributes to lower electric-assist system costs and simplified electric-assist system configuration.

In the meantime, owing to the aforementioned cooling action for the electric motor 11, more of heat, removed from the electric motor 11 (stator 21 and rotor 22) by air suctioned into the second compressor wheel 5, is delivered to the second-stage compressor wheel (i.e., the second compressor wheel 5). The heat removed from the electric motor 11 is a disadvantage in rising a boost pressure at the second compressor stage, that is, from the viewpoint of satisfactory pressurizing/compressing action of the second compressor wheel 5.

For the reasons discussed above, in the shown embodiment, as shown in FIGS. 2-3, for the purpose of positively forced-cooling a control unit 30 itself in addition to forced-cooling for (i) the air flowing through the communicating passage 17 and forced-cooling for (ii) electric motor 11 (in particular, the motor stator 21), while paying attention to the control unit 30 having an electronic circuit board and the like installed in a control-unit casing for controlling the electric motor 11 incorporated within the turbocharger 1, and fixed and placed right above the second housing 15 constructing a part of the compressor housing 8, a cooling mechanism 31 is further provided (see FIGS. 4-5). By the way, in FIG. 1, which is a partially cutaway view of the turbocharger 1, the control unit 30 is not shown. Also, the upper-half and the lower-half of the longitudinal cross-section of FIG. 2 are synthesized by two different cross-sections.

As shown in FIGS. 1-3, the air immediately after having been pressurized and compressed by the first compressor wheel 4 flows through the communicating passage 17 defined inside of the compressor housing 8 to the suction side of the second compressor wheel 5, as discussed above. For the purpose of forced-cooling the air flowing through the communicating passage 17, as a first cooling part of the cooling mechanism 31, a first water jacket 32 into which cooling water (e.g., coolant) is supplied and through which the cooling water circulates, is formed in diametrically-opposing respective ribs, namely, the comparatively thick-walled upper rib 24 and the comparatively thick-walled lower rib 24. These diametrically-opposing ribs 24, 24 are configured to protrude radially outwards from the outer periphery of motor housing 20 and to radially cross the communicating passage 17. As clearly shown in FIGS. 2 and 4, upper and lower first water jacket portions, constructing the first water jacket 32, are formed to extend in the longitudinal direction of rib 24 (in other words, in the longitudinal direction of shaft member 6). As appreciated from the perspective view of FIG. 4, the upper and lower first water jacket portions, constructing the first water jacket 32, are communicated with each other through respective circular-arc shaped communicating passages 33, 33 at both ends of each of the upper and lower first water jacket portions in the longitudinal direction of rib 24.

In a similar manner, for the purpose of positively forced-cooling the stator 21 of electric motor 11 installed in the communicating passage 17 as well as means for cooling the stator 21 by the flow of air through the communicating passage 17, as a second cooling part of the cooling mechanism 31, a second water jacket 34, into which cooling water is supplied and through which the cooling water circulates, is formed in the motor housing 20. As shown in FIG. 4, the second water jacket 34 is formed as a continuous spirally-wound cooling-water passage by which the stator 21 is surrounded by a plurality of turns in the circumferential direction at regular intervals.

Furthermore, for the purpose of forced-cooling the control unit 30, because the control unit 30 for controlling the electric motor 11 is fixedly positioned around the second housing 15 constructing a part of the compressor housing 8, as a third cooling part of the cooling mechanism 31, a third water jacket 35, into which cooling water is supplied and through which the cooling water circulates, is formed in the second housing 15. As shown in FIG. 4, the third water jacket 35 is formed as a continuous meanderingly-shaped cooling-water passage circumferentially meandering more than once within a specified circumferential section of the second housing 15.

As shown in FIGS. 4-5, the inlets of the first, second, and third water jackets 32, 34, and 35, all included in the cooling mechanism 31, are connected to a common cooling-water supply pipe 36 through respective connecting pipes (branch pipes) branched from the common cooling-water supply pipe 36. The outlets of the first, second, and third water jackets 32, 34, and 35 are merged into a common cooling-water exhaust pipe 37. Actually, in order to provide a liquid-cooled forced circulation system that enables forced-circulation of cooling water, also provided are a heat exchanger (not shown) and a cooling-water pump (not shown) and the like in addition to the cooling-water supply pipe 36 and the cooling-water exhaust pipe 37.

An electromagnetic directional control valve 38 (serving as cooling-water distribution means), such as an electromagnetic rotary multi-directional control valve, is disposed at the branch point (the branched portion) of the three branch pipes branched from the cooling-water supply pipe 36. In the shown embodiment, directional control valve 38 is configured to enable mode-switching, depending on a vehicle operating condition, among (i) a first cooling-water distribution mode in which cooling water is supplied to any one of the first, second, and third water jackets 32, 34, and 35, (ii) a second cooling-water distribution mode in which cooling water is supplied to any two of the first, second, and third water jackets 32, 34, and 35, and (iii) a third cooling-water distribution mode in which cooling water is supplied to all of the first, second, and third water jackets 32, 34, and 35.

As shown in FIGS. 4-5, three water-temperature sensors 39, 40, and 41 are mounted on the respective outlet sides (downstream sides) of the first, second, and third water jackets 32, 34, and 35, and also a water-temperature sensor 42 is mounted on the control unit 30. Output signals from these water temperature sensors 39, 40, 41, and 42 are sent to a valve controller (not shown), which is configured to control an operating mode (an operating position) of directional control valve 38.

More concretely, during an accelerating condition of the vehicle, the previously-noted third cooling-water distribution mode is selected for supplying cooling water to all of the first, second, and third water jackets 32, 34, and 35. Hence, (i) the air flowing through the communicating passage 17, (ii) the stator 21 of electric motor 11, and (iii) the control unit 30 can be all forced-cooled by heat-exchange (heat-transfer) between the air flowing through the communicating passage 17 and the cooling water flowing through the first water jacket 32, by heat-exchange between the motor stator 21 and the cooling water flowing through the second water jacket 34, and by heat-exchange between the control unit 30 and the cooling water flowing through the third water jacket 35. In contrast, when the vehicle operating condition is shifted from the vehicle accelerating condition to a constant-speed running state, the first cooling-water distribution mode is selected for supplying cooling water to only the first water jacket 32. Hence, the air flowing through the communicating passage 17 can be forced-cooled.

Also, when the turbocharger 1 is driven by exhaust gas energy, the third cooling-water distribution mode is selected for supplying cooling water to all of the first, second, and third water jackets 32, 34, and 35. Hence, the air flowing through the communicating passage 17, the stator 21 of electric motor 11, and the control unit 30 can be all forced-cooled by the three different water jackets 32, 34, and 35, which are provided independently of each other. Furthermore, during a decelerating condition of the vehicle, the second cooling-water distribution mode is selected for supplying cooling water to the second water jacket 34 and the third water jacket 35. Hence, the stator 21 of electric motor 11 and the control unit 30 can be forced-cooled. The previously-noted three different cooling-water distribution modes form the basis of cooling-water supply patterns for supplying cooling water to at least one of three different water jackets 32, 34, and 35. Additionally, the degree of relative priority of these cooling-water supply patterns can be appropriately changed depending on latest up-to-date informational signals generated from water temperature sensors 39, 40, 41, and 42.

According to the two-stage supercharging electric-assist turbocharger of the embodiment, the air flowing through the communicating passage 17 can be forced-cooled by cooling water flowing through the first water jacket 32. Hence, there is a less tendency for the air suctioned into the second-stage compressor wheel as well as the air suctioned into the first-stage compressor wheel to be thermally affected by heat generated by the electric motor 11. In particular, the first water jacket 32 (the first forced-cooling part) is advantageous with respect to the air cooling performance of air suctioned into the second-stage compressor wheel, thus greatly improving the boost pressure.

The stator 21 of electric motor 11 can be forced-cooled by cooling water flowing through the second water jacket 34, and thus it is possible to greatly suppress a deterioration in the driving efficiency of electric motor 11. Additionally, the control unit 30 for controlling the electric motor 11 can be forced-cooled by cooling water flowing through the third water jacket 35, and thus an original motor-control function of the control unit 30 can be maintained stably. Also, there is a less tendency for the air suctioned into each of the compressor wheels 4 and 5 to be thermally affected by heat generated by the control unit 30.

Furthermore, the first, second, and third water jackets 32, 34, and 35 are eventually built in the compressor housing 8. Hence, an external cooler (or an external heat exchanger), separated from the main housing, is unnecessary. This is very advantageous with respect to downsizing and space-saving around the turbocharger 1.

In the shown embodiment, as an example of installation location of a control unit for electric-motor control, the control unit 30 is fixedly positioned on the outer periphery of the second housing 15 constructing a part of the compressor housing 8. The installation location of control unit 30 is not limited to the particular embodiment shown and described herein. In lieu thereof, the control unit 30 may be arranged adjacent to the compressor housing 8 as an external control unit separated from the compressor housing 8.

Also, in the shown embodiment, the cooling-water distribution means is exemplified in an electromagnetic directional control valve 38 disposed at the branched portion of a cooling-water supply system of the cooling mechanism 31. The cooling-water distribution means is not limited to the electromagnetic directional control valve 38 shown and described herein. Instead of using the previously-discussed directional control valve as a cooling-water distribution means, for the purpose of flow control, flow-constriction orifices (or flow-control valves) may be appropriately disposed in respective branch pipes branched from the cooling-water supply pipe 36 of the cooling-water supply system. For instance, with flow-constriction orifices whose area settings determine the controlled cooling-water flow rates through the respective orifices, a flow rate of cooling water to be distributed to each of the first, second, and third water jackets 32, 34, and 35 can be univocally predetermined depending on a cooling load (in other words, a thermal load) of each of the first, second, and third water jackets. Alternatively, with flow-control valves whose flow-rate settings determine the controlled cooling-water flow rates through the respective flow control valves, a flow rate of cooling water to be distributed to each of the first, second, and third water jackets 32, 34, and 35 can be univocally predetermined depending on a cooling load (in other words, a thermal load) of each of the first, second, and third water jackets. In a similar manner to the use of directional control valve 38, through the use of the flow-constriction orifices (or the flow-control valves), the cooling efficiency of the entire cooling system can be improved. Also, the use of flow-constriction orifices, each having a simplified flow-rate control structure, is advantageous with respect to lower system installation time and costs, in other words, excellent mountability of the overall system on the vehicle.

Moreover, in the shown embodiment, as three different cooling parts, constructing the cooling mechanism 31, the first, second, and third water jackets 32, 34, and 35 are exemplified. These three different cooling parts are not limited to such water-jacket type of heat exchangers. For instance, the first water jacket 32 may be replaced with small-size heat exchangers built in respective ribs 24. In a similar manner, the third water jacket 35 may be replaced with a small-size heat exchanger partly built in the second housing 15. Also, instead of integrally forming the third cooling part (i.e., the third water jacket 35 or the built-in heat exchanger) in the second housing 15, the third cooling part for forced-cooling the control unit 30 may be arranged within the control unit 30 itself.

The entire contents of Japanese Patent Application No. 2016-095004 (filed Mar. 11, 2016) are incorporated herein by reference.

While the foregoing is a description of the preferred embodiments carried out the invention, it will be understood that the invention is not limited to the particular embodiments shown and described herein, but that various changes and modifications may be made without departing from the scope or spirit of this invention as defined by the following claims.

What is claimed is:
1. A turbocharger comprising:
a turbine wheel driven by exhaust gases exhausted from an internal combustion engine;
a first compressor wheel and a second compressor wheel both coaxially connected to the turbine wheel through a common shaft;
a main housing that accommodates therein the first and second compressor wheels and has a communicating passage defined inside of the main housing; wherein the communicating passage directs compressed air from the first compressor wheel to the second compressor wheel;
an electric motor having a cylindrical motor housing and installed in the communicating passage and mounted on the common shaft;
a plurality of radiating fins provided between the main housing and the cylindrical motor housing inside of the main housing and configured to partition the communicating passage into a plurality of regions in a circumferential direction;
a control unit configured to control the electric motor; and a cooling mechanism structured to cool potential heat-generation portions inside of and outside of the main housing, wherein the cooling mechanism further comprises:
(i) a first water jacket formed in at least one of the plurality of radiating fins configured to cool the air in the communicating passage by supplying cooling water to the first water jacket;
(ii) a second water jacket formed in the cylindrical motor housing configured to cool a stator of the electric motor by supplying cooling water to the second water jacket; and
(iii) a third water jacket formed in a part of the main housing configured to cool the control unit by supplying cooling water to the third water jacket.

2. The turbocharger as recited in claim 1, wherein:
the control unit is fixedly positioned on an outer periphery of the main housing.

3. The turbocharger as recited in claim 1, wherein:
the control unit is positioned adjacent to the main housing.

4. The turbocharger as recited in claim 1, further comprising:
a cooling water distributor being an electromagnetic directional control valve provided in a cooling-water supply system of the cooling mechanism configured to switch between a supply mode and a shut-off mode of cooling water being supplied to each of the first, second, and third water jackets, depending on an operating condition of a vehicle on which the internal combustion engine is mounted.

5. The turbocharger as recited in claim 1, further comprising:
at least one of a plurality of flow control valves and a plurality of flow constriction orifices provided in a cooling-water supply system of the cooling mechanism, and structured to predetermine a flow rate of cooling water to be distributed to each of the first, second, and third water jackets, depending on a cooling load of each of the first, second, and third water jackets.

6. The turbocharger as recited in claim 1, wherein:
the radiating fins are configured to protrude radially outwards from an outer periphery of the motor housing as viewed in an axial direction of the common shaft, and continuously formed over an entire axial length of the electric motor from a first axial end of the electric motor facing the first compressor wheel to a second axial end of the electric motor facing the second compressor wheel.

7. The turbocharger as recited in claim 1, wherein:
in the electric motor, the air prevailing in an inlet of the communicating passage is introduced through a first axial end of the motor housing facing the first compressor wheel into the motor housing, and the introduced air is exhausted from a second axial end of the motor housing facing the second compressor wheel into an outlet of the communicating passage.

* * * * *